United States Patent
Campbell

(10) Patent No.: US 7,030,405 B2
(45) Date of Patent: Apr. 18, 2006

(54) METHOD AND APPARATUS FOR RESISTANCE VARIABLE MATERIAL CELLS

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 10/761,369

(22) Filed: Jan. 22, 2004

(65) Prior Publication Data

US 2004/0149980 A1 Aug. 5, 2004

Related U.S. Application Data

(63) Continuation of application No. 10/100,450, filed on Mar. 14, 2002, now Pat. No. 6,849,868.

(51) Int. Cl.
*H01L 29/04* (2006.01)
*H01L 21/00* (2006.01)

(52) U.S. Cl. ............... 257/3; 257/10; 257/200; 438/95; 438/258

(58) Field of Classification Search ............. 257/3, 257/10, 200, 529; 365/158; 438/95, 256, 438/259
See application file for complete search history.

(56) References Cited

U.S. PATENT DOCUMENTS

| | | | |
|---|---|---|---|
| 3,622,319 A | 11/1971 | Sharp | |
| 3,743,847 A | 7/1973 | Boland | |
| 3,753,110 A | 8/1973 | Ikeda et al. | |
| 4,115,872 A | 9/1978 | Bluhm | |
| 4,203,123 A | 5/1980 | Shanks | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,671,618 A | 6/1987 | Wu et al. | |
| 4,795,657 A | 1/1989 | Formigoni et al. | |
| 4,800,526 A | 1/1989 | Lewis | |
| 4,847,674 A | 7/1989 | Sliwa et al. | |
| 5,177,567 A | 1/1993 | Klersy et al. | |

(Continued)

FOREIGN PATENT DOCUMENTS

EP 1 202 285 A2 2/2002

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—David Nelms
*Assistant Examiner*—Long Tran
(74) *Attorney, Agent, or Firm*—Dickstein Shapiro Morin & Oshinsky LLP

(57) ABSTRACT

The present invention is related to methods and apparatus to produce a memory cell or resistance variable material with improved data retention characteristics and higher switching speeds. In a memory cell according to an embodiment of the present invention, silver selenide and a chalcogenide glass, such as germanium selenide ($Ge_xSe_{(1-x)}$) are combined in an active layer, which supports the formation of conductive pathways in the presence of an electric potential applied between electrodes. Advantageously, embodiments of the present invention can be fabricated with relatively wide ranges for the thicknesses of the silver selenide and glass layers.

13 Claims, 6 Drawing Sheets

U.S. PATENT DOCUMENTS

| | | | |
|---|---|---|---|
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,314,772 A | 5/1994 | Kozicki | |
| 5,315,131 A | 5/1994 | Kishimoto et al. | |
| 5,350,484 A | 9/1994 | Gardner et al. | |
| 5,360,981 A | 11/1994 | Owen et al. | |
| 5,363,329 A | 11/1994 | Troyan | |
| 5,418,640 A | 5/1995 | Hood | |
| 5,500,532 A | 3/1996 | Kozicki | |
| 5,512,328 A | 4/1996 | Yoshimura et al. | |
| 5,512,773 A | 4/1996 | Wolf et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,914,893 A | 6/1999 | Kozicki et al. | |
| 5,920,788 A | 7/1999 | Reinberg | |
| 5,952,671 A | 9/1999 | Reinberg | |
| 5,998,066 A | 12/1999 | Block et al. | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,117,720 A | 9/2000 | Harshfield | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,348,365 B1 * | 2/2002 | Moore et al. | 438/130 |
| 6,350,679 B1 | 2/2002 | McDaniel et al. | |
| 6,376,284 B1 | 4/2002 | Gonzalez et al. | |
| 6,388,324 B1 | 5/2002 | Kozicki et al. | |
| 6,391,688 B1 | 5/2002 | Gonzalez et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,440,837 B1 | 8/2002 | Harshfield | |
| 6,469,364 B1 | 10/2002 | Kozicki | |
| 6,473,332 B1 | 10/2002 | Ignatiev et al. | |
| 6,487,106 B1 | 11/2002 | Kozicki | |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 * | 11/2002 | Kozicki et al. | 438/259 |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 * | 2/2003 | Kozicki | 365/150 |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0049912 A1 | 3/2003 | Campbell et al. | |
| 2003/0068861 A1 | 4/2003 | Li | |
| 2003/0068862 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |

FOREIGN PATENT DOCUMENTS

| | | |
|---|---|---|
| GB | 1187965 | 5/1967 |
| JP | 50-18597 | 9/1973 |
| JP | 56126916 | 10/1981 |
| JP | 59-20913 | 2/1984 |
| JP | 2-122501 | 5/1990 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S. R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouate, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C., Commutations dans les counches minces de selenium, Phys. Stat. vol. (a), 97-102 (1981).

Bernede, J.C.; Abachi, T., Differential negative resistance in metal/insulator/ metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in AG2Se/Se/M thin film sandwiches, Thin solid films 97 (1982) 165-171.

Bernede, J.C.; Khelil, A.; Kettaf, M.; Conan, A., Transition from S- to N-type differential negative resistance AI-AI2O3-Ag-2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near X=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P., Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986)2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Teinic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A. M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B., Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel. M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.;Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep pf Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J.Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B, 74 (1996) 37-50.

Hu, J.; Snell, A.J.; Hajto, J.; Owen, A.E., Current-induced instability in Cr-p+a-Si:H-V thin film devices, Phil. Mag B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 26 (1987) 15-21.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x ($0 <= x <= 0.571$) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-Doped Chalcogenides, Electochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys, Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and ir-reversible electrical switching in TeO2-V2O5 based glasses, Journal de Physique IV2 (1992) C2-185-C2-188.

McHardy et al., The dissolution of metals in amorphous chalcogenides and the effects electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 846-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S,R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductorsm Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.;Asokan, S.; Ghare, D.B.; Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.; Hajto,J.;Lecomber,P.G.;Gage,S.M.;Choi,W.K.; Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a -Si:J memory devices, Mat. Res. Soc. Symp. Proc. V 258, 1991, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B.Chem. Soc. Japan, No. 12, pp. 3662-3365 (1973).

Snell, A.J.;Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide anorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy, L.; Ticha, H., Remark on the glass-forming ability in $Ge_xSe_{1-x}$ and $As_xSe_{1-x}$ systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag-Ge-Se: Ionic conduction and exafs structural investigation, Transport-structure relations in fast Ion and mixed conductors Proceedings of the 6th Riso International symposium. Sep. 9-13, 1985.

Tregouet, Y.; Bernede, J.C., Silver movements in $Ag_2Te$ thin films: switching and memory effects, Thin Solid Films 57 (1979) 49-54.

Uemura, O.; Kameda, Y.; Kokai, S.; Satow, T., Thermally induced crystallization of amorphous $Ge0.4Se0.6$, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behavior of amorphous selenium films, J. Non-Cryst. Solids 33 (1976) 267-272.

Vodenicharov, C.; Parvanov,S.;Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.

40|Ag System prepared by photodissloution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature Tg, with average coordination number, <m>, in network glasses: evidence of a threshold behavior in the slope |dTg/d21 m>| at the rigidity percolation threshold (<m>=2.4), J. Non-Cryst. Solids 151 (1992) 149-154.

Yoji Kawamoto, et al.; "Ionic Conduction in $As_2S_3$-$Ag_2S$, $GeS_2$-GeS-$Ag_2S$ and $P_2S_5$-$Ag_2S$ Glasses" Journal of Non-Crystalline Solids 20, 393-404 (1976).

* cited by examiner

METHOD AND APPARATUS FOR RESISTANCE VARIABLE MATERIAL CELLS

This application is continuation of U.S. patent application Ser. No. 10/100,450, filed Mar. 14, 2002 now U.S. Pat. No. 6,849,868, entitled "METHODS AND APPARATUS FOR RESISTANCE VARIABLE MATERIAL CELLS", which is hereby incorporated by reference herein in its entirety.

BACKGROUND OF THE INVENTION

1. Field of the Invention

The present invention is generally related to memory technology. In particular, the present invention relates to memory devices formed using chalcogenide glasses.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. In addition, certain volatile memories such as DRAM devices require periodic refresh cycles to retain their data even when power is continuously supplied.

In contrast to the potential loss of data encountered in volatile memory devices, nonvolatile memory devices retain data when power is removed. Examples of nonvolatile memory devices include read only memory (ROM), programmable read only memory (PROM), erasable programmable read only memory (EPROM), electrically erasable programmable read only memory (EEPROM), and the like.

U.S. Pat. No. 6,084,796 to Kozicki, et al., entitled "Programmable metallization cell structure and method of making same," discloses another type of nonvolatile memory device known as a programmable conductor memory cell or a programmable metallization cell (PMC). U.S. Pat. No. 6,084,796 is herein incorporated by reference in its entirety. Such memory cells can be integrated into a memory device, which is known as a programmable conductor random access memory (PCRAM). Additional applications for a programmable metallization cell include use as a programmable resistance and a programmable capacitance.

One conventional technique for producing the programmable conductor memory cell applies silver (Ag) photodoping to a chalcogenide glass, such as germanium selenide $(Ge_xSe_{(1-x)})$. As reported by Mitkova, et al, in "Dual Chemical Role of Ag as an Additive in Chalcogenide Glasses," *Physical Review Letters*, Vol. 83, no. 19 (Nov. 8, 1999), pp. 3848–3851, silver (Ag) can only be photodoped into glasses of specific stoichiometries that form silver selenide and a new glass stoichiometry backbone. Further, glasses that can be photodoped with silver (Ag) are "floppy" and switch relatively slowly as compared to a rigid glass. Boolchand, et al., in *Onset of Rigidity in Steps in Chalcogenide Glass*, Properties and Applications of Amorphous Materials, pp. 97–132, (2001), observes a floppy to rigid transition in $Ge_xSe_{(1-x)}$ glasses that occurs when x=0.23, where x corresponds to the germanium molar concentration.

In addition, Mitkova, et al., found that glasses that fall within the stoichiometry range defined by region II of FIG. 1 of the Mitkova reference do not form silver selenide when doped with silver (Ag). For example, a rigid glass, such as germanium selenide $(Ge_{0.40}Se_{0.60})$ will not form silver selenide when photodoped with silver (Ag) and, as a result, does not function as a memory switch.

The presence of silver selenide in a $Ge_xSe_{1-x}$ glass photodoped with silver (Ag) allows the glass to be used as a memory switch. Glasses used for silver (Ag) incorporation via photodoping are floppy and switch more slowly electrically, and with worse memory retention, than glasses that are rigid. Preferred rigid glasses, e.g., $Ge_{0.40}Se_{0.60}$, do not form silver selenide when photodoped with silver (Ag). However, the relatively fast switching times and relatively good memory retention occur in a system which incorporates silver selenide and a rigid glass such as $Ge_{0.40}Se_{0.60}$. What is needed is a technique to form this type of memory cell.

SUMMARY OF THE INVENTION

Embodiments of the invention overcome the disadvantages of the prior art. Embodiments of the invention include processes that advantageously allow the production of resistance variable material memory cells at relatively high rates and with relatively high yields. The resistance variable memory cells further advantageously feature improvements in switching speed, improvements in switching consistency, and improvements in data retention and operational temperature ranges relative to conventional programmable conductor memory cells.

Advantageously, embodiments of the present invention can be fabricated with relatively wide ranges for the thicknesses of silver chalcogenide and glass layers. Thus, memory cells can be fabricated without the relatively precise control of silver (Ag) and glass thicknesses that are necessary in a conventional photodoping process to maintain an appropriate amount of silver (Ag) in the glass without inducing crystallization in the memory cell. In addition, embodiments of the present invention can advantageously form memory cells on rigid glasses, such as $Ge_{0.40}Se_{0.60}$, which would normally incorporate silver (Ag) into the glass backbone making it unavailable for memory switching. These glasses have an additional advantage of having higher glass transition temperatures.

In one embodiment, silver (Ag) is not added directly to germanium selenide $(Ge_xSe_{(1-x)})$. Thus, adherence of a layer of silver (Ag) to a layer of germanium selenide $(Ge_xSe_{(1-x)})$ is advantageously not a concern.

One embodiment according to the present invention includes a memory cell with a layer of a silver chalcogenide and a layer of a chalcogenide glass, such as germanium selenide $(Ge_xSe_{(1-x)})$. The layers of silver chalcogenide and chalcogenide glass are formed between two electrodes, which are also formed. The electrodes can be formed from materials such as tungsten (W), tungsten nitride (WN), titanium (Ti), and the like. The silver chalcogenide can correspond to a variety of materials, such as silver selenide, silver sulfide, silver telluride, and silver oxide. The chalcogenide glass can correspond to a variety of materials, such as germanium selenide $(Ge_xSe_{(1-x)})$, germanium sulfide $(Ge_xS_{(1-x)})$ and arsenic selenide $(As_xSe_y)$.

Another embodiment according to the present invention includes a memory cell with a layer of silver (Ag), a layer of chalcogenide glass, such as germanium selenide $(Ge_xSe_{(1-x)})$, and a layer of silver selenide disposed between two electrodes. In one embodiment, the layers are arranged such that the chalcogenide glass is disposed between the layer of silver (Ag) and the layer of silver selenide. The chalcogenide glass can be selected from a variety of glasses such as $Ge_{0.40}Se_{0.60}$ and $Ge_{0.25}Se_{0.75}$. In one embodiment, the silver selenide is slightly poor in silver (Ag) and the presence of silver (Ag) in the silver (Ag) layer allows the memory cell to function as intended.

Another embodiment according to the present invention includes a memory cell with co-deposited silver selenide and germanium selenide ($Ge_xSe_{(1-x)}$). The memory cell can correspond to non-volatile memories or to volatile memories.

One embodiment according to the present invention is a process of fabricating a memory. The process forms an active layer on a bottom electrode. The process forms the active layer, which includes a silver chalcogenide, such as silver selenide, and a selenium-including glass, such as germanium selenide, substantially in the absence of an ultraviolet (UV) photodoping step. The process also forms a top electrode layer such that a voltage applied between the top electrode layer and the bottom electrode layer creates a conductive pathway between the two electrodes, or disrupts a conductive pathway that had connected the two electrodes.

Another embodiment according to the present invention includes a physical vapor deposition (PVD) process of fabricating an active layer in a memory cell. The PVD process fabricates the active layer by co-depositing silver chalcogenide, such as silver selenide, and a chalcogenide glass, such as germanium selenide ($Ge_xSe_{(1-x)}$), on a bottom electrode at substantially the same time. The process forms a top electrode layer on the active layer such that a voltage or difference in electric potential applied between the top electrode layer and the bottom electrode can form or disrupt a conductive pathway within the active layer.

Another embodiment according to the present invention includes a deposition process to form an active layer in a substrate assembly by forming a layer of a chalcogenide glass and forming a layer of silver selenide. The layers are disposed between a top electrode layer and a bottom electrode layer. In one embodiment, the chalcogenide glass is germanium selenide ($Ge_xSe_{(1-x)}$), and there are no other sources of silver (Ag) other than silver selenide. In another embodiment, the chalcogenide glass is germanium selenide ($Ge_xSe_{(1-x)}$) and at least one of the electrodes is silver (Ag).

Another embodiment according to the present invention includes a process that forms an active layer of a memory cell by forming a layer of both germanium selenide ($Ge_xSe_{(1-x)}$) and silver (Ag) and forming a layer of silver selenide.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the invention is defined only by reference to the appended claims.

While illustrated in the context of silver selenide and germanium selenide, the skilled artisan will appreciate that the principles and advantages described herein are applicable to other types of silver chalcogenides and chalcogenide glasses. For example, other silver chalcogenides include silver sulfide, silver telluride, and silver oxide. Another chalcogenide glass includes arsenic selenide ($As_xSe_y$).

Applicant has discovered that regions of silver selenide within germanium selenide ($Ge_xSe_{(1-x)}$) are the source of the memory switching characteristic of silver (Ag) ultraviolet (UV) photodoped germanium selenide glasses in a resistance variable material memory cell. Mitkova, et al., observed with Modulated Differential Scanning Calorimetry (MDSC) experiments that silver (Ag) photodoping of germanium selenide ($Ge_xSe_{(1-x)}$) glasses of glass forming region I (selenide rich glasses) resulted in phase separation of silver selenide and a new stoichiometry of germanium selenide ($Ge_ySe_{(1-y)}$) backbone.

Figure 1:
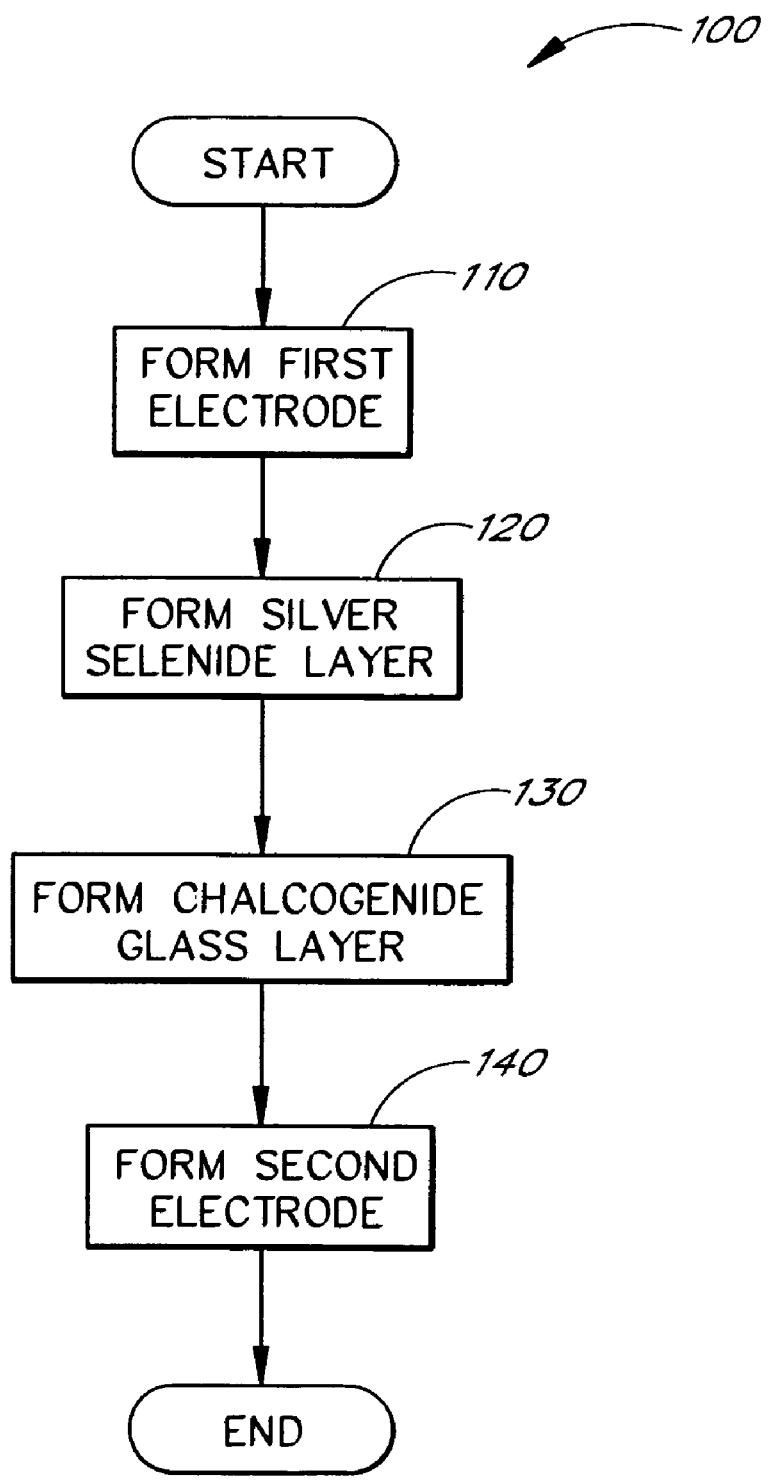
FIG. 1 illustrates a process according to an embodiment of the invention of forming an active layer by layering silver selenide and a chalcogenide glass.

FIG. 1 illustrates a process 100 according to an embodiment of the invention of forming an active layer for a memory cell by layering silver selenide and a chalcogenide glass. The term "silver selenide," as used herein, includes stoichiometric silver selenide ($Ag_2Se$), silver-rich silver selenide ($Ag_{2+x}Se$), and silver-poor silver selenide ($Ag_{2-x}Se$). The term "chalcogenide glass," as used herein, includes glasses with an element from group VIA (or group 16) of the periodic table. Group VIA elements include sulfur (S), selenium (Se), tellurium (Te), polonium (Po), and oxygen (O). In one embodiment, the process advantageously eliminates the UV photodoping step.

The process can be applied to a broad variety of substrate assemblies. Advantageously, many configurations for a resistance variable material cell, such as the "PROM configured MDM" described by Kozicki, et al., in U.S. Pat. No. 6,084,796, do not require local transistors as part the storage element and can thus be formed on a variety of substrates and not just semiconductors. For example, a resistance variable material cell can be formed on other materials such as a plastic substrate. The substrate assembly should be electrically insulating so that a difference in electric potential can be applied between electrodes to form or to disrupt a conductive pathway in the cell. Where the substrate assembly is not intrinsically insulating, the process can also form an insulating layer, such as a layer of silicon oxide ($SiO_2$), to electrically insulate the resistance variable material cell. In one embodiment, the substrate assembly is silicon to facilitate the integration of the fabricated memory cell with electronic devices such as switches or transistors.

The process forms 110 a conductive film on the substrate assembly to form a first electrode of the memory cell. The material used to form the conductive film can be selected from a variety of conductive materials. In one embodiment, the process deposits tungsten (W) as the first electrode. The process advances from forming 110 the first electrode to forming 120 a silver selenide layer.

The process forms 120 a film or layer of silver selenide onto the first electrode. In the process illustrated by FIG. 1, the process first forms 120 a silver selenide layer and then forms 130 a germanium selenide ($Ge_xSe_{(1-x)}$) layer. It will be understood by one of ordinary skill in the art that in another embodiment, the process first forms 130 a germanium selenide layer ($Ge_xSe_{(1-x)}$) and then forms 120 a silver selenide layer. A variety of processes can be used to form 120 the layer of silver selenide. Preferably, physical vapor deposition (PVD) techniques, such as evaporative deposition and sputtering, are used to form 120 the layer of silver selenide. Other processes, such as chemical vapor deposition (CVD), co-evaporation, and depositing a layer of selenide (Se) above a layer of silver (Ag) to form silver selenide can also be used.

Advantageously, silver selenide is directly deposited, thereby obviating the need to photodope the substrate with UV radiation. Of course, UV photodoping can still be used. Where UV photodoping is still used, the direct forming of a layer of silver selenide can still advantageously reduce the intensity and/or the duration of the applied UV radiation. Further advantageously, since light does not need to shine on the silver selenide layer, the silver selenide layer can be formed 120 prior to the forming 130 of the chalcogenide layer as shown in FIG. 1. The process advances from forming 120 the silver selenide layer to forming 130 the chalcogenide layer.

The process forms 130 a layer of a chalcogenide glass. For example, the chalcogenide glass can be germanium selenide ($Ge_xSe_{(1-x)}$), arsenic selenide ($As_2Se_3$), and the like. Preferably, the chalcogenide glass formed is germanium selenide ($Ge_xSe_{1-x}$). In one embodiment, x is in a range of about 0.2 to about 0.43. An exemplary chalcogenide glass is $Ge_{0.40}Se_{0.60}$.

Preferably, the process forms 120 the silver selenide layer, and the process forms 130 the layer of germanium selenide ($Ge_xSe_{(1-x)}$) such that the silver selenide layer is between about 300 to 1000 Angstroms (Å) thick, and such that the germanium selenide ($Ge_xSe_{(1-x)}$) layer is between about 200 to 1000 Å thick. In one embodiment, the silver selenide layer is about 400 Å thick, and the germanium selenide ($Ge_xSe_{(1-x)}$) layer is a layer of $Ge_{0.40}Se_{0.60}$ that is about 250 Å thick.

The process forms 140 a second electrode of the resistance variable material cell, and the process ends. It will be understood by one of ordinary skill in the art that the first electrode and the second electrode can correspond to, for example, a top electrode and a bottom electrode, respectively, or to side electrodes. The layer of silver selenide formed 120 by the process and the layer of chalcogenide glass formed 130 by the process are disposed between the first electrode and the second electrode. When an electric potential is applied between the first electrode and the second electrode, a conductive pathway is formed or is disrupted in the layer of silver selenide and the layer of chalcogenide glass.

The formation of the conductive pathway lowers the resistance between the electrodes. The conductive pathway persists after the removal of the applied electric potential. This property can permit some embodiments of a resistance variable material cell to retain information in a nonvolatile manner.

Figure 2:
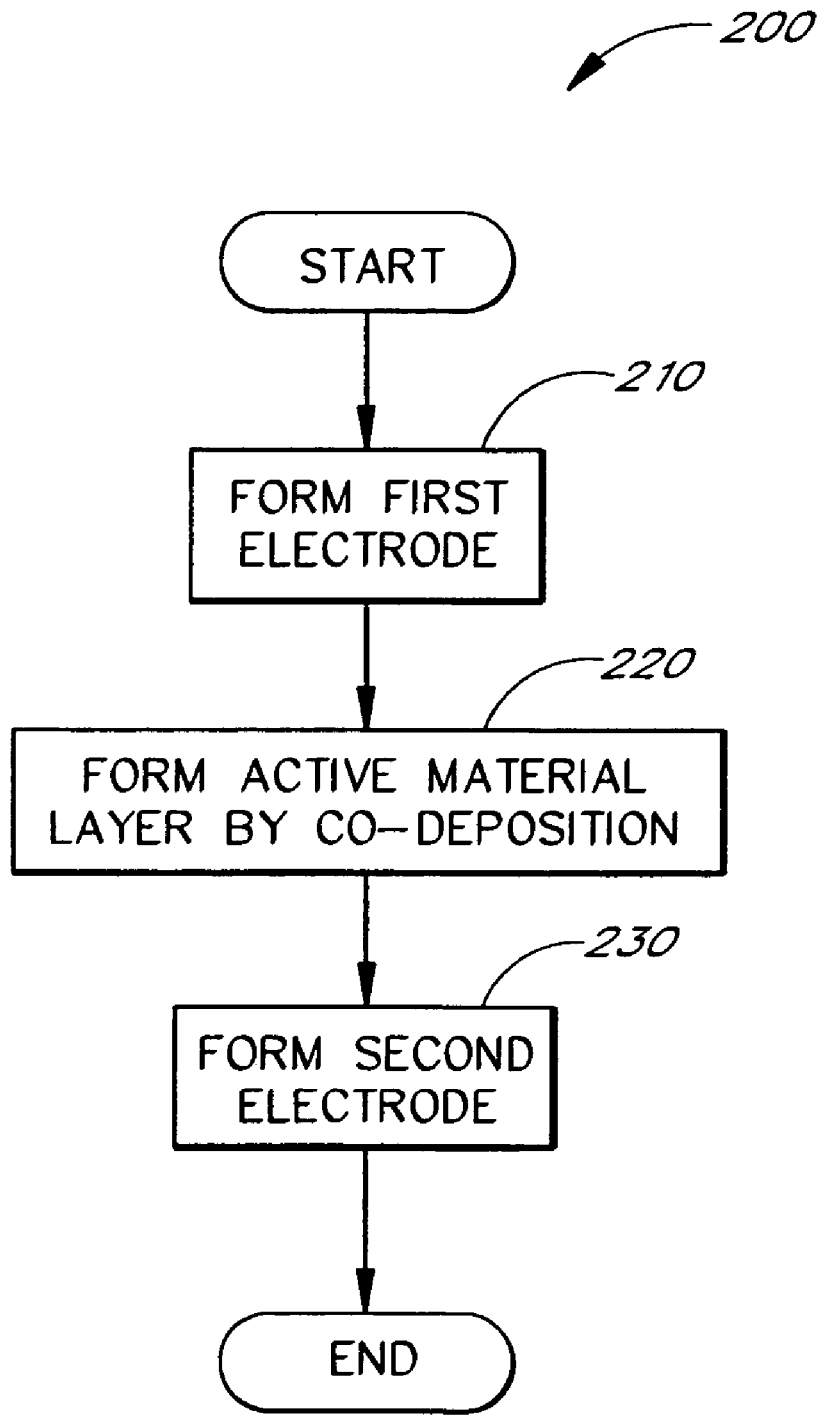
FIG. 2 illustrates a process according to an embodiment of the invention of forming an active layer by co-depositing silver selenide and a chalcogenide glass.

FIG. 2 illustrates another process 200 according to an embodiment of the invention of forming an active layer for a memory cell. In the illustrated process, the active layer is formed by depositing silver selenide and a chalcogenide glass substantially in a single step. In one embodiment, the process advantageously eliminates the UV photodoping step.

The process illustrated in FIG. 2 can also be applied to a broad variety of substrate assemblies as described earlier in connection with FIG. 1. The process forms 210 a conductive film on the substrate assembly to form a first electrode of the memory cell. The material used to form the conductive film can be selected from a variety of conductive materials as described earlier in connection with FIG. 1. The process advances from forming 210 the first electrode to forming 220 an active layer.

The process forms 220 the active film in which a conductive pathway forms and/or is disrupted. The illustrated process co-deposits 220 silver selenide and a chalcogenide glass to form 220 the active layer. In one embodiment, physical vapor deposition (PVD) techniques such as evaporative deposition, sputtering, and the like, are used to form 220 the active layer. The chalcogenide glass can include materials such as germanium selenide ($Ge_xSe_{(1-x)}$), arsenic selenide ($As_2Se_3$), and the like. In one embodiment, the chalcogenide glass is germanium selenide ($Ge_xSe_{(1-x)}$), where x is between about 0.2 and about 0.43.

The thickness of the active layer formed by the process can vary in a relatively broad range. Preferably, the process forms 220 the active layer to a thickness between about 500 Å and about 2000 Å. More preferably, the process forms 220 the active layer to a thickness between about 500 Å and about 700 Å. In one example, the process forms 220 the active layer to a thickness of about 500 Angstroms (Å).

Advantageously, the illustrated process can form an active layer without silver (Ag) photodoping with UV radiation. In another embodiment, UV photodoping is still used. The process advances from forming 220 the active layer to forming 230 a second electrode.

The process forms 230 a conductive film on the substrate assembly to form a second electrode of the memory cell, and the process ends. The active layer formed 220 is disposed between the first electrode and the second electrode. When an electric potential is applied between the first electrode and the second electrode, a conductive pathway is formed or disrupted depending on the polarity of the applied electric potential. The formation and/or disruption of the conductive pathway is stable and can be detected as a change in impedance.

Figure 3:
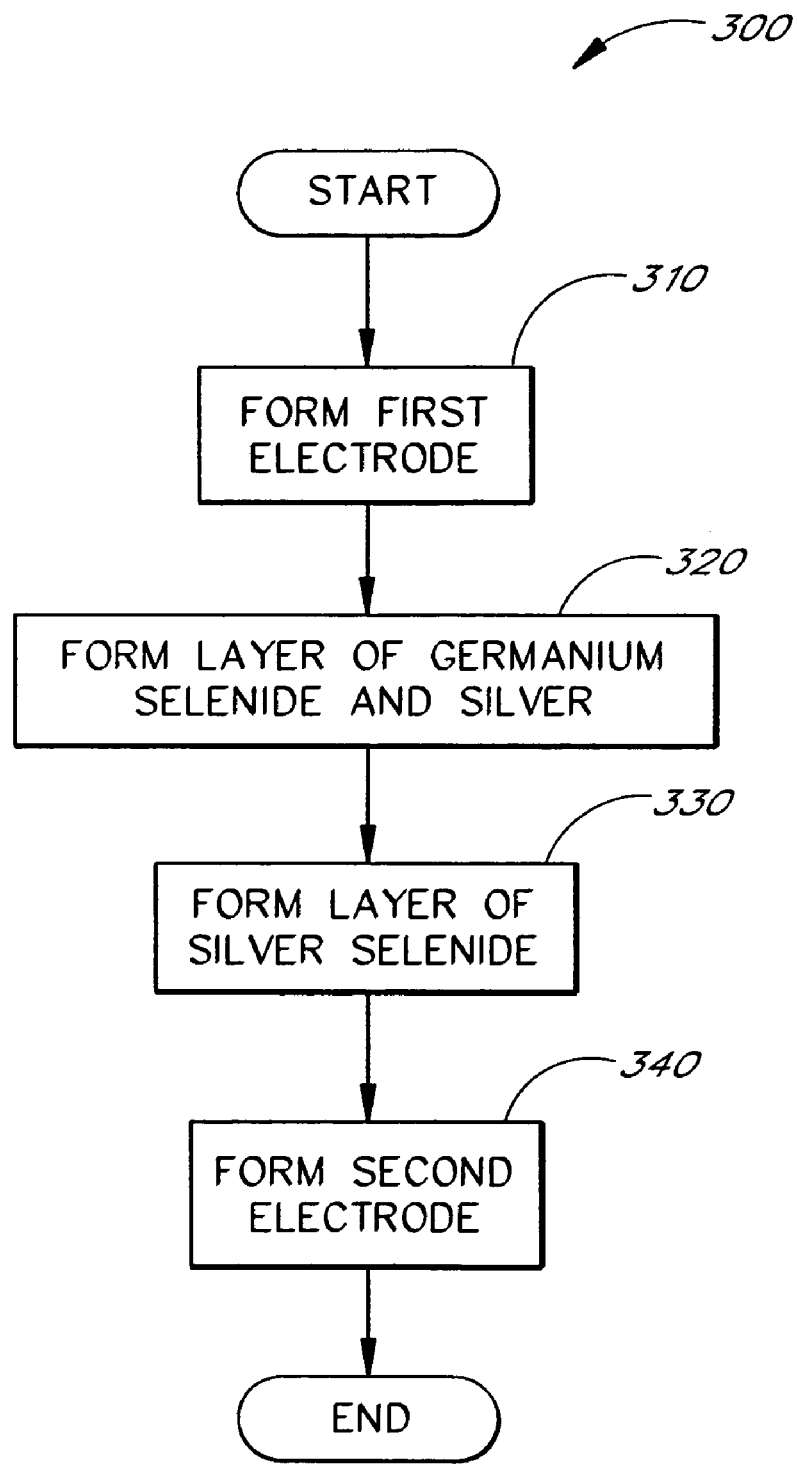
FIG. 3 illustrates a process according to an embodiment of the invention of forming an active layer by depositing a layer of germanium selenide ($Ge_xSe_{(1-x)}$) and silver (Ag) and a layer of silver selenide.

FIG. 3 illustrates a process 300 according to an embodiment of the invention of forming an active layer of a memory cell by depositing a layer of germanium selenide ($Ge_xSe_{(1-x)}$) and silver (Ag), and a layer of silver selenide. In one embodiment, x is in a range of about 0.2 to about 0.43.

The process forms 310 a conductive film on a substrate assembly to form a first electrode of the memory cell. The material used to form the conductive film can be selected from a variety of conductive materials. In one embodiment, the process deposits tungsten (W) as the first electrode. The process advances from forming 310 the first electrode to forming 320 a film or layer of germanium selenide ($Ge_xSe_{(1-x)}$) and silver (Ag).

The process forms 320 the layer(s) of germanium selenide ($Ge_xSe_{(1-x)}$) and silver (Ag) onto the first electrode. The process can form the layer(s) of germanium selenide ($Ge_xSe_{(1-x)}$) and silver (Ag) in one layer or as separate layers. In one embodiment, the process co-deposits germanium selenide ($Ge_xSe_{(1-x)}$) and silver (Ag) to form 320 the layer. In another embodiment, the process forms 320 the layer(s) of germanium selenide ($Ge_xSe_{(1-x)}$) and silver (Ag) by depositing separate layers of germanium selenide ($Ge_xSe_{(1-x)}$) and silver (Ag). One embodiment according to the invention forms a relatively thin layer of silver (Ag), and then forms the layer of germanium selenide ($Ge_xSe_{(1-x)}$). In one embodiment, the relatively thin layer of silver (Ag) is about 50 Å thick. A layer of silver selenide should not be formed adjacent to the relatively thin layer of silver (Ag). Preferably, the process forms 320 the film or layer of germanium selenide ($Ge_xSe_{(1-x)}$) and silver (Ag) to a thickness between about 250 Å and 1000 Å.

In the process illustrated by FIG. 3, the process forms 320 the layer(s) of both germanium selenide ($Ge_xSe_{(1-x)}$) and silver (Ag) and then forms 330 a layer of silver selenide. Preferably, the process forms 330 the layer of silver selenide to a thickness between about 300 Å and about 1000 Å. It will be understood by one of ordinary skill in the art that in another embodiment, the process first forms 330 the silver selenide layer and then forms 320 the layer(s) of germanium selenide ($Ge_xSe_{(1-x)}$) and silver (Ag). In addition, the deposition of the relatively thin film of silver (Ag) advantageously allows the silver selenide layer to be formed slightly silver-poor because an extra amount of silver (Ag) is available to the memory cell.

A variety of processes can be used to form 320 the layer(s) of germanium selenide ($Ge_xSe_{(1-x)}$) and silver (Ag). Preferably, physical vapor deposition (PVD) techniques, such as evaporative deposition and sputtering, are used to form 320 the layer of germanium selenide ($Ge_xSe_{(1-x)}$) and silver (Ag). Other processes, such as chemical vapor deposition (CVD) and co-evaporation can also be used. The process advances from forming 320 the layer of germanium selenide ($Ge_xSe_{(1-x)}$) and silver (Ag) to forming 330 a layer of silver selenide.

The process forms 330 a layer of a silver selenide. The layer of silver selenide should be formed on the germanium selenide ($Ge_xSe_{(1-x)}$) layer or on a co-deposited layer of silver (Ag) and germanium selenide ($Ge_xSe_{(1-x)}$), but not directly on a silver (Ag) layer. Advantageously, silver selenide is directly deposited and a UV photodoping step is not needed.

The process forms 340 a second electrode of the memory cell, and the process ends. It will be understood by one of ordinary skill in the art that the first electrode and the second electrode can correspond to, for example, a top electrode and a bottom electrode, respectively, or to side electrodes. The layer(s) of germanium selenide ($Ge_xSe_{(1-x)}$) and silver (Ag) formed 320 by the process and the layer of silver selenide formed 330 by the process are disposed between the first electrode and the second electrode. When an electric potential is applied between the first electrode and the second electrode, a conductive pathway is formed or is disrupted in the layer of silver selenide and the layer(s) of germanium selenide ($Ge_xSe_{(1-x)}$) and silver (Ag).

The stored information can correspond to programmable resistances and to binary data storage. In one embodiment, where the memory cell stores binary data, a first state corresponds to a relatively low resistance between the electrodes and a second state corresponds to a relatively high resistance between the electrodes. In addition, the polarity of the electrodes can be reversed to alter the conductive pathway, thereby allowing the memory cell to be erased and reprogrammed.

Figure 4:
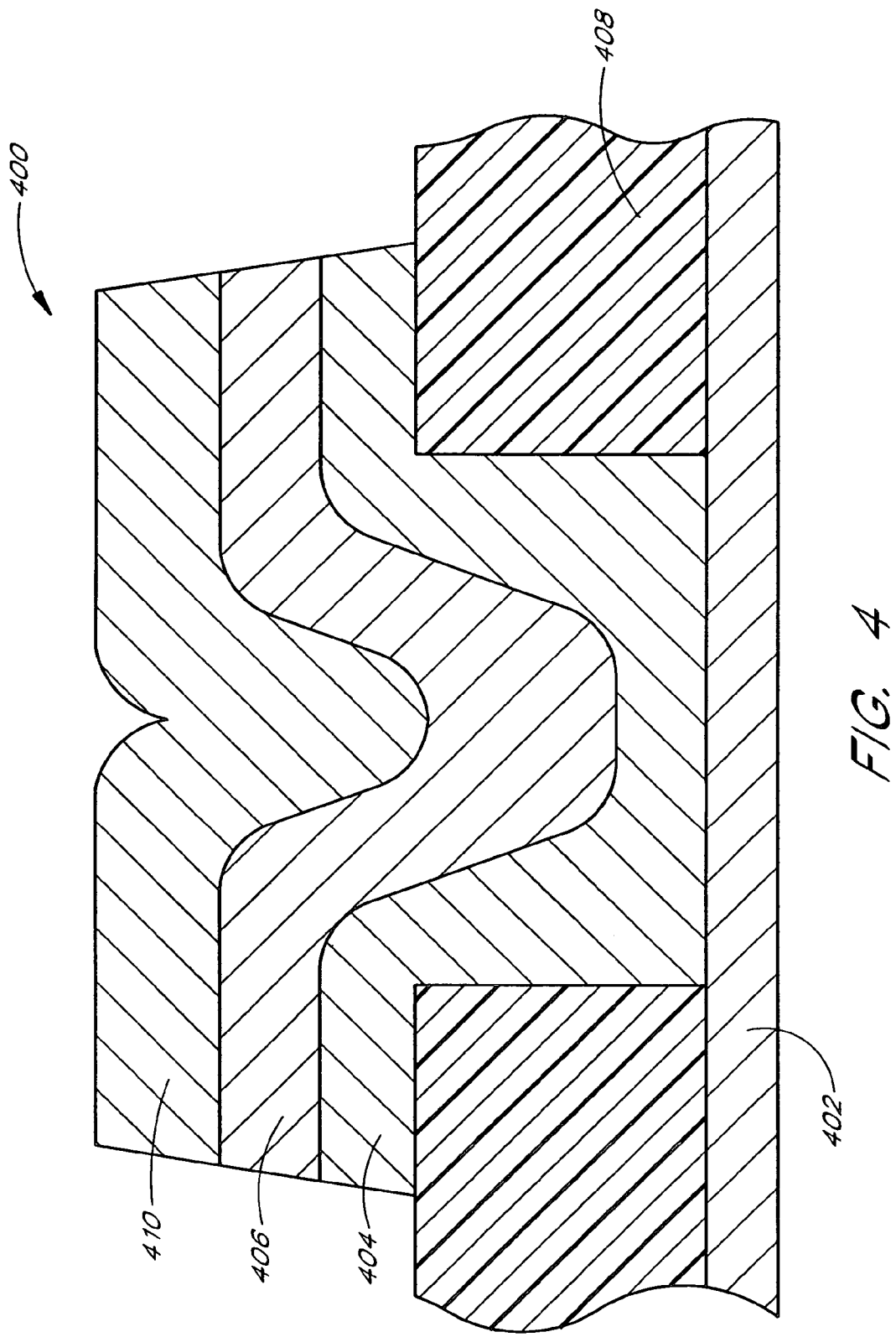
FIG. 4 illustrates a memory cell with an active layer formed by layering silver selenide and a chalcogenide glass.

FIG. 4 illustrates one embodiment according to the present invention of a memory cell 400 with an active layer formed by layering silver selenide and a chalcogenide glass. The illustrated memory cell 400 includes a first electrode 402, a first body layer 404, a second body layer 406, an insulator 408, and a second electrode 410.

The first electrode 402 is formed on and in contact with a substrate assembly. In one embodiment, the substrate assembly is silicon, and the first electrode 402 is coupled to a conductor such as a crosspoint so that the memory cell 400 can be programmed and read. The skilled artisan will appreciate that the memory cell 400 can be formed on a variety of substrate materials and not just semiconductors such as silicon. For example, the memory cell 400 can be formed on a plastic substrate. The first electrode 402 can be made from a variety of materials and from combinations of materials. For example, the first electrode 402 can be made from tungsten (W), tungsten nitride (WN), polysilicon, and the like.

When the memory cell 400 is fabricated, the first body layer 404 and the second body layer 406 form a body of the memory cell 400. The first body layer 404 is formed on the first electrode 402, and the second body layer 406 is formed on the first body layer 404.

In the illustrated embodiment, the first body layer 404 is a layer of silver selenide and the second body layer 406 is a layer of a chalcogenide glass such as germanium selenide ($Ge_xSe_{(1-x)}$). In another embodiment, the first body layer 404 is the layer of chalcogenide glass and the second body layer 406 is the layer of silver selenide.

In the illustrated embodiment, the insulator 408 surrounds the body formed by the first body layer 404 and the second body layer 406. The insulator 408 insulates the body from the bodies of other memory cells and also prevents the undesired diffusion of active material. The insulator 408 can be formed from a variety of materials such as silicon nitride ($Si_3N_4$). Of course, the insulator 408 can be formed in multiple steps and can include multiple structures.

The second electrode 410 is formed on the second body layer 406 and on the insulator 408. The second electrode 410 can be formed from a variety of materials such as silver (Ag), titanium (Ti), tungsten (W), tungsten nitride (WN), and the like. An electric potential applied between the first electrode 402 and the second electrode 410 causes the formation or alteration of conductive pathways in the body of the memory cell 400.

Figure 5:
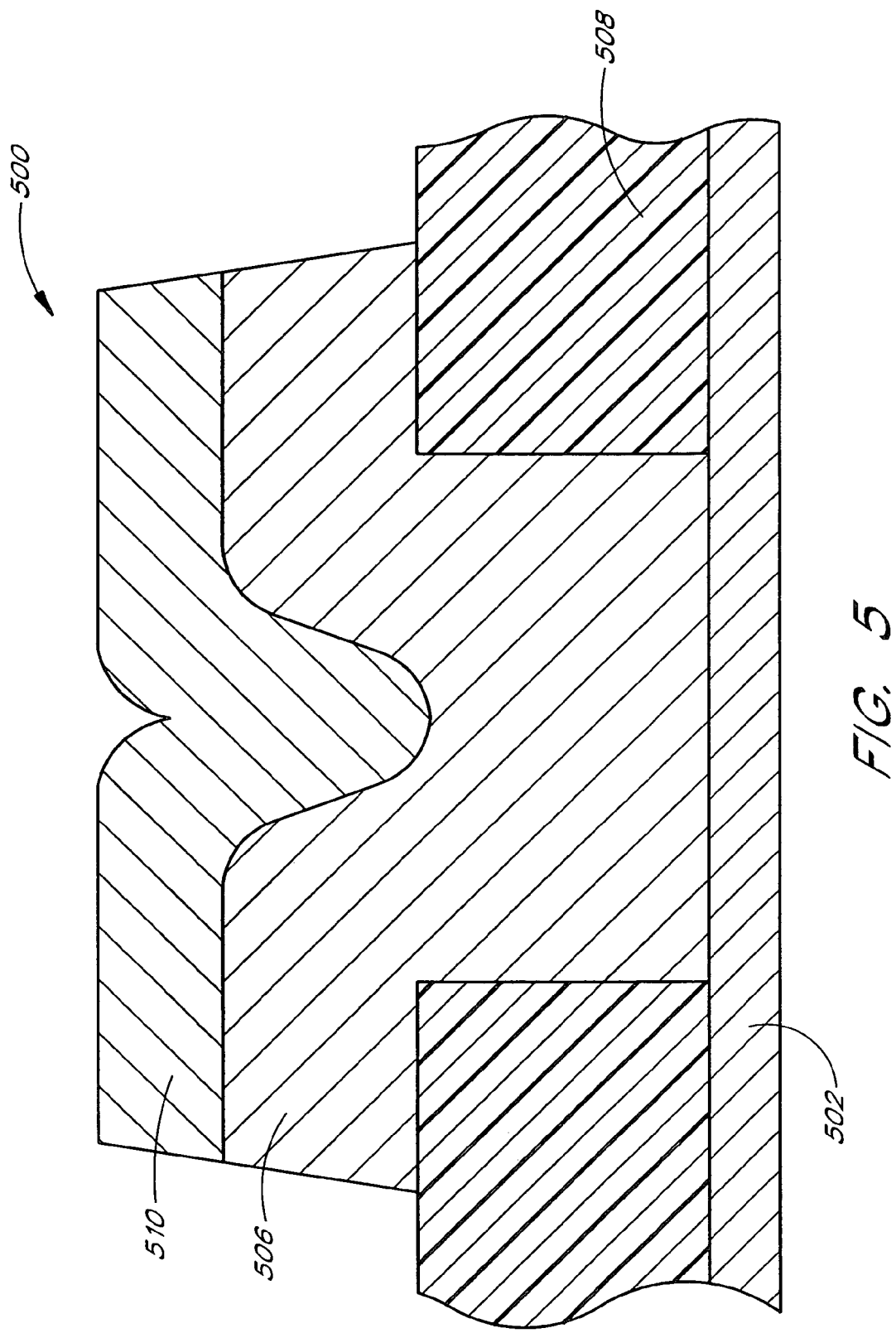
FIG. 5 illustrates a memory cell with an active layer formed by co-depositing silver selenide and a chalcogenide glass.

FIG. 5 illustrates one embodiment according to the present invention of a memory cell 500 with an active layer formed by co-depositing silver selenide and a chalcogenide glass. The illustrated memory cell 500 includes a first electrode 502, an active layer 506, an insulator 508, and a second electrode 510.

The first electrode 502 is formed on a substrate assembly. The substrate assembly can correspond to a variety of materials including plastic and silicon. Preferably, the first electrode 502 is coupled to a conductor such as a crosspoint so that the memory cell 500 can be programmed and read. The first electrode 502 can be made from a variety of materials and from combinations of materials.

The active layer 506 is formed on the first electrode 502. In the illustrated embodiment, the active layer 506 is a co-deposited layer of silver selenide and a chalcogenide glass such as germanium selenide ($Ge_xSe_{(1-x)}$).

In the illustrated embodiment, the insulator 508 surrounds the active layer 506. The insulator 508 insulates the active layer 506 from other memory cells and also prevents the undesired diffusion of active material. The insulator 508 can be formed from a variety of materials such as silicon nitride ($Si_3N_4$).

The second electrode 510 is formed on the active layer 506 and on the insulator 508. The second electrode 510 can be formed from a variety of materials such as silver (Ag), titanium (Ti), tungsten (W), tungsten nitride (WN), and the like. An electric potential applied between the first electrode 502 and the second electrode 510 causes conductive pathways in the active layer 506 to form or to disrupt in response to the applied electric potential.

Figure 6:
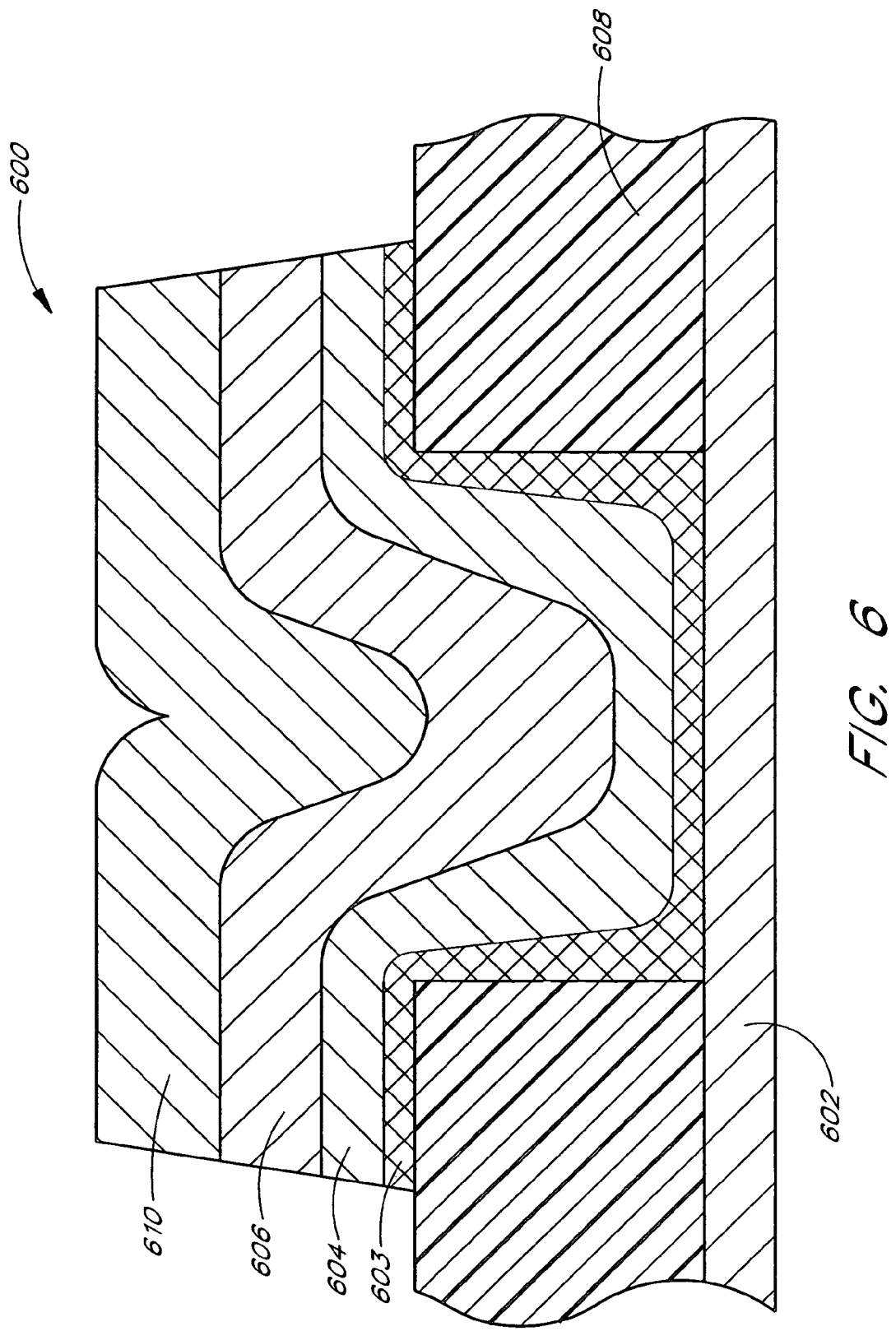
FIG. 6 illustrates a memory cell with an active layer formed by layering silver (Ag), layering a chalcogenide glass, and layering silver selenide.

FIG. 6 illustrates one embodiment according to the present invention of a memory cell 600 with an active layer formed by layering silver (Ag), layering a chalcogenide glass, and layering silver selenide. The illustrated memory cell 600 includes a first electrode 602, a first body layer 603, a second body layer 604, a third body layer 606, an insulator 608, and a second electrode 610.

The first electrode 602 is formed on and in contact with a substrate assembly. In one embodiment, the substrate assembly is silicon, and the first electrode 602 is coupled to a conductor such as a crosspoint so that the memory cell 600 can be programmed and read. The first electrode 602 can be made from a variety of materials and from combinations of materials such as tungsten (W), tungsten nitride (WN), titanium (Ti), and the like.

When the memory cell 600 is fabricated, the first body layer 603, the second body layer 604, and the third body layer 606 form a body of the memory cell 600. The first body layer 603 is formed on the first electrode 602, the second body layer 604 is formed on the first body layer 603, and the third body layer 606 is formed on the second body layer 604.

In the illustrated embodiment, the first body layer 603 is a layer of silver (Ag), the second body layer 604 is a layer of a chalcogenide glass such as germanium selenide (Ge$_x$Se$_{(1-x)}$), and the third body layer 606 is a layer of silver selenide. In another embodiment, the first body layer 603 is the layer of silver selenide, the second body layer 604 is the layer of chalcogenide glass, and the third body layer 606 is the layer of silver (Ag).

In the illustrated embodiment, the insulator 608 surrounds the body formed by the first body layer 603, the second body layer 604, and the third body layer 606. The insulator 608 insulates the body from the bodies of other memory cells and also prevents the undesired diffusion of active material. The insulator 608 can be formed from a variety of materials such as silicon nitride (Si$_3$N$_4$). Of course, the insulator 608 can be formed in multiple steps and can include multiple structures.

The second electrode 610 is formed on the third body layer 606 and on the insulator 608. The second electrode 610 can be formed from a variety of materials such as tungsten (W). An electric potential applied between the first electrode 602 and the second electrode 610 causes the formation or alteration of conductive pathways in the body of the memory cell 600.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

I claim:

1. A memory cell comprising:
   a first electrode over a substrate;
   a second electrode, wherein the first electrode and the second electrode provide electrical access to a memory cell body;
   a silver chalcogenide layer disposed between the first electrode and the second electrode, where the silver chalcogenide layer forms a first portion of the memory cell body; and
   a rigid chalcogenide glass layer, wherein the rigid chalcogenide glass layer is disposed between the first electrode and the second electrode and forms a second portion of the memory cell body, wherein the rigid chalcogenide glass comprises silver chalcogenide material from said silver chalcogenide layer in an amount such that a conductive pathway can form in said rigid chalcogenide glass layer in response to an electric potential applied between the first electrode and the second electrode.

2. The memory cell of claim 1, wherein the silver chalcogenide layer is formed directly on the first electrode.

3. The memory cell of claim 1, wherein the rigid chalcogenide glass layer is formed directly on the first electrode.

4. The memory cell of claim 1, wherein the silver chalcogenide layer comprises silver selenide.

5. The memory cell of claim 1, wherein the silver chalcogenide layer comprises silver sulfide.

6. The memory cell of claim 1, wherein the silver chalcogenide layer comprises silver telluride.

7. The memory cell of claim 1, wherein the silver chalcogenide layer comprises silver oxide.

8. The memory cell of claim 1, wherein the rigid chalcogenide glass layer comprises germanium selenide (Ge$_x$Se$_{(1-x)}$).

9. The memory cell of claim 1, wherein the rigid chalcogenide glass layer comprises arsenic selenide (As$_x$Se$_y$).

10. The memory cell of claim 1, wherein the rigid chalcogenide glass layer comprises germanium sulfide (Ge$_x$S$_{(1-x)}$).

11. The memory cell of claim 1, wherein the rigid chalcogenide glass layer comprises selenium and can be doped with silver, but remain an amorphous material.

12. The memory cell of claim 1, further comprising a silver layer disposed between the first electrode and the second electrode, wherein said silver layer forms a third portion of said memory cell body.

13. The memory cell of claim 1, wherein at least one of the first electrode and the second electrode comprises tungsten (W).

* * * * *